United States Patent
Moliton et al.

(10) Patent No.: US 8,933,689 B2
(45) Date of Patent: Jan. 13, 2015

(54) DEVICE FOR MEASURING THE ELECTRIC CURRENT FLOWING IN AN ELECTRIC APPARATUS, SAID DEVICE ENABLING POWER MEASUREMENT, AND AN ELECTRIC APPARATUS COMPRISING SAME

(75) Inventors: Vivien Moliton, Seyssins (FR); Sébastien Buffat, Tullins (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 106 days.

(21) Appl. No.: 13/536,434

(22) Filed: Jun. 28, 2012

(65) Prior Publication Data
US 2013/0002236 A1    Jan. 3, 2013

(30) Foreign Application Priority Data

Jun. 28, 2011   (FR) ..................... 11 01985

(51) Int. Cl.
  *G01R 15/18*   (2006.01)
  *G01R 15/14*   (2006.01)
  (Continued)

(52) U.S. Cl.
  CPC .............. *G01R 15/142* (2013.01); *G01R 19/15* (2013.01); *G01R 15/181* (2013.01);
  (Continued)

(58) Field of Classification Search
  CPC .. G01R 15/181; G01R 15/186; G01R 15/142; G01R 19/15; G01R 1/22; G01R 31/006; G01R 31/44; H01F 27/24; H01F 38/28; H01F 38/36; H01F 71/125
  USPC .............. 324/76.11, 115, 126, 127, 129, 149; 336/56, 145, 182, 192, 198, 208, 212
  See application file for complete search history.

(56) References Cited

U.S. PATENT DOCUMENTS

| 4,286,213 A | 8/1981 | Fowler |
| 4,558,310 A | 12/1985 | McAllise |

(Continued)

FOREIGN PATENT DOCUMENTS

| DE | 10 2006 059384 A1 | 6/2008 |
| EP | 0 528 634 A2 | 2/1993 |
| EP | 2 282 321 A1 | 2/2011 |
| FR | 2 891 946 A1 | 4/2007 |
| WO | WO2004112217 | * 12/2004 |
| WO | WO 2008/144161 A1 | 11/2008 |

OTHER PUBLICATIONS

FR 2891946, machine tranlation.*

*Primary Examiner* — Huy Q Phan
*Assistant Examiner* — Raul Rios Russo
(74) *Attorney, Agent, or Firm* — Steptoe & Johnson LLP

(57) ABSTRACT

A device for measuring an electric quantity such as electric current flowing in an electric equipment unit, which device is in a case fitted on a mounting support, and having pass-through holes and terminals separated by insulating material, their number corresponding to the number of phases of the equipment unit, the holesto permit a conductor to pass therethrough, to be electrically connected to strips of terminals of the equipment unit the opposite end to electric contact strips of a load-side or line-side apparatus from the equipment unit and, for at least one terminal of the device, a magnetic core at least partially surrounding such terminal with an air-gap around which a secondary measuring coil is wound between two end portions of the magnetic core which define the air-gap, the coil(s) delivering a signal representative of the current flowing in the apparatus.

16 Claims, 14 Drawing Sheets

Figure 1:
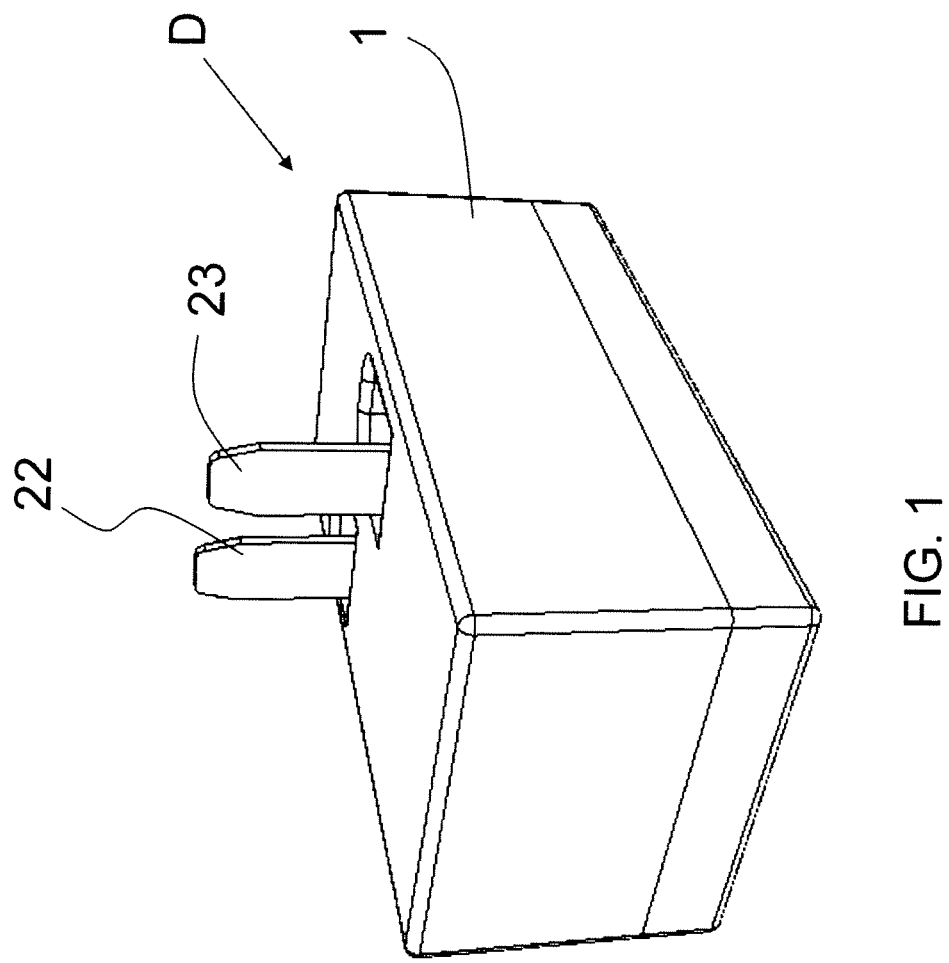

(51) Int. Cl.
*G01R 19/15* (2006.01)
*H01F 38/36* (2006.01)
*H01H 71/12* (2006.01)
*G01R 5/14* (2006.01)
*G01R 11/04* (2006.01)
*G01R 21/06* (2006.01)

(52) U.S. Cl.
CPC ............ *G01R 15/186* (2013.01); *H01F 38/36* (2013.01); *H01H 71/125* (2013.01); *G01R 11/04* (2013.01); *G01R 21/06* (2013.01)
USPC .......................................... 324/127; 324/129

(56) References Cited

U.S. PATENT DOCUMENTS

| | | | | |
|---|---|---|---|---|
| 5,617,019 | A * | 4/1997 | Etter | 324/117 R |
| 6,046,580 | A * | 4/2000 | Cibie | 323/355 |
| 7,265,531 | B2 * | 9/2007 | Stauth et al. | 324/117 H |
| 8,294,452 | B2 * | 10/2012 | Roellgen et al. | 324/117 H |
| 2008/0054898 | A1 * | 3/2008 | Hausperger et al. | 324/260 |
| 2009/0058737 | A1 * | 3/2009 | Tsujimura et al. | 343/702 |
| 2009/0115403 | A1 * | 5/2009 | Bernklau | 324/127 |

* cited by examiner

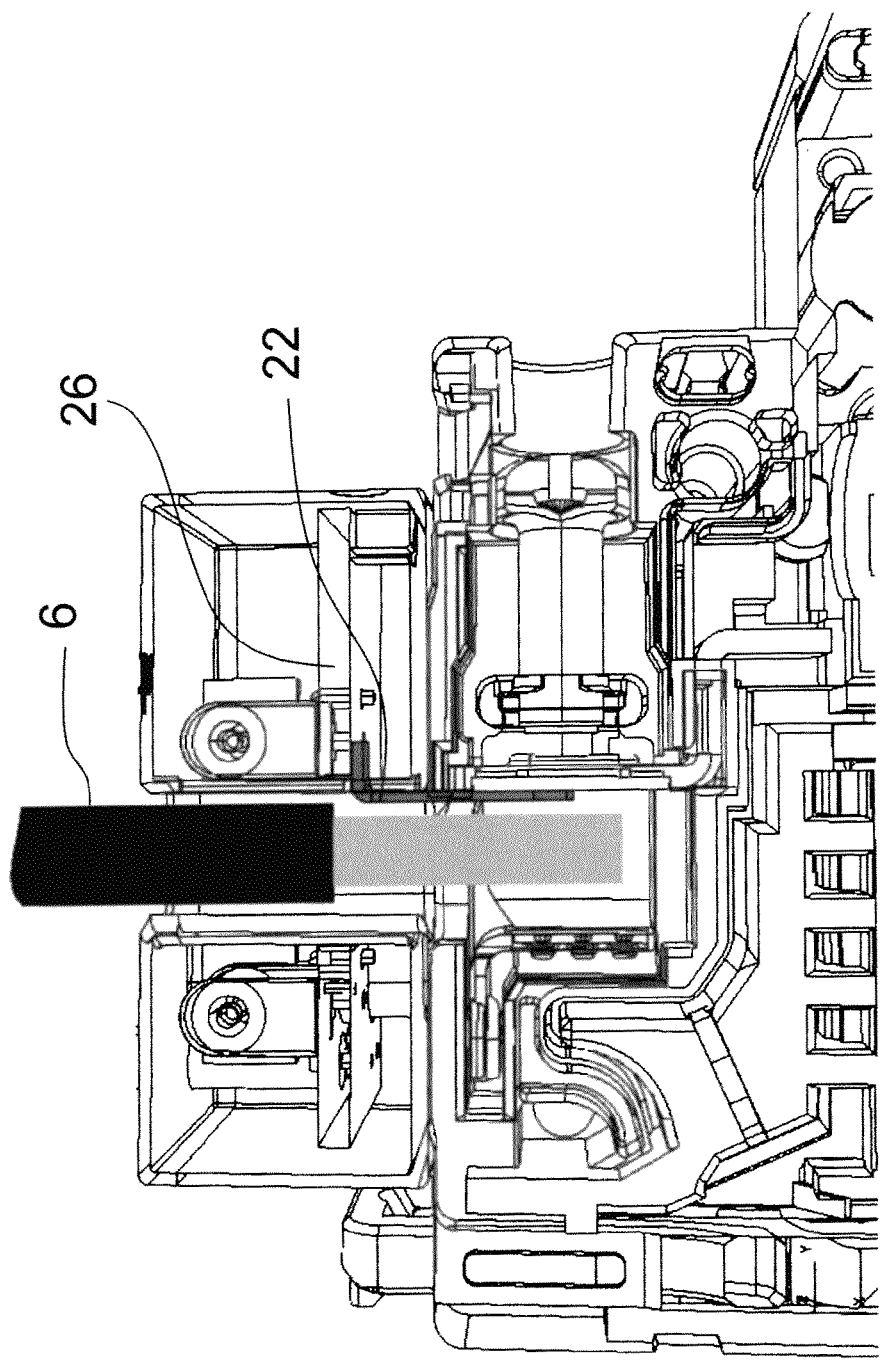

DEVICE FOR MEASURING THE ELECTRIC CURRENT FLOWING IN AN ELECTRIC APPARATUS, SAID DEVICE ENABLING POWER MEASUREMENT, AND AN ELECTRIC APPARATUS COMPRISING SAME

The present invention relates to a device for measuring at least one electric quantity comprising the electric current flowing in an electric equipment unit, said equipment unit being housed in a case designed to be fitted on a mounting support, and to an electric equipment unit comprising one such device.

Electric protection apparatuses comprising power measuring devices integrated in the cases of said apparatuses are known.

In these apparatuses, measurement of the current and voltage is therefore performed in intrusive manner, as the measuring means are located inside the apparatuses.

The present invention solves this problem and proposes a device for measuring the current and voltage that is of simple design being able to be associated with a standard electric protection apparatus fitted on a mounting support, for example of "DIN rail" type, said device being integrated in an available volume reduced in width to that of the protection unit while meeting the class 2 measurement precision objectives, current measurement being performed in non-intrusive manner without the usual direct access of the electric wires connected to the terminals of said equipment unit being prevented or restrained, and without adding any connections, as well as an electric protection apparatus comprising one such device.

For this purpose, one object of the present invention is to provide a device for measuring at least one electric quantity comprising the electric current flowing in an electric equipment unit, said device being housed in a case designed to be fitted on a mounting support, this device being characterized in that it comprises a certain number of pass-through holes forming terminals delineated by a part made from insulating material, this number corresponding to the number of phases of the equipment unit, said holes forming terminals being designed to each be passed through by a conductor, said conductors being designed to be electrically connected via one of their ends respectively to the contact strips of the terminals of the equipment unit called first unit, and via their opposite end to the electric contact strips of an apparatus located load-side or line-side from said first equipment unit and, for at least one of the terminals of the device, a magnetic core at least partially surrounding said terminal and comprising at least one air-gap around which at least one measuring coil called secondary coil is wound between the two end portions of the magnetic core delineating said air-gap, said coil(s) delivering a signal representative of the current flowing in the apparatus.

According to a particular feature, the above-mentioned part(s) delineating the pass-through opening(s) present(s) a U-shaped cross-section.

According to a particular feature, the above-mentioned magnetic core comprises two U's separated by two air-gaps, a secondary measuring coil being placed around each of the two air-gaps, said coils being connected in series and delivering a signal representative of the current flowing in the apparatus.

According to another feature, the above-mentioned magnetic U's are achieved with a drawn round wire presenting a diameter of about 1 mm.

According to another feature, the magnetic U's are made from Fe Si or Fe Ni.

According to another feature, the magnetic U's are made by stacking a certain number of layers of nanocrystalline material.

According to another feature, the magnetic core is formed by a U-shaped part comprising two end parts separated by an air-gap, between which a secondary coil for measuring the current flowing in the equipment unit is placed.

According to another feature, this magnetic core is composed of three branches welded to one another, these three branches being formed by stacking of metal plates.

According to another feature, the branches of the U are made from orientated grain 3% FeSi.

According to another feature, the above-mentioned magnetic core is composed of two separate I-shapes forming two air-gaps between them at their ends, each I being designed to channel the magnetic flux, each air-gap being formed by two facing end parts of the two I-shapes, each air-gap receiving a secondary measuring coil arranged between two facing end parts respectively belonging to the two I-shapes.

According to another feature, each I-shape is formed by stacking of metal plates made from orientated grain 3% FeSi.

According to another feature, the end of the branches of the I-shapes overshoots the coils so as to minimize the possible influence of external magnetic fields.

According to another feature, this device is fitted inside a case called first case, designed to be fixed in removable manner to the case called second case of the equipment unit.

According to another feature, the above-mentioned case called first case comprises two pins salient from an outer surface of said case, said pins being designed on the one hand to enable voltage tapping to be performed on the contact strips of the terminals of the equipment unit via one of their ends called first end, and on the other hand to perform securing of the case called first case with respect to the case called second case, said pins being electrically connected via their opposite end to voltage measuring means.

According to another feature, the pins are electrically connected to a printed circuit card comprising the above-mentioned voltage measuring means.

According to another feature, at least a part of the elements situated inside the case called first case are coated in a resin with a high dielectric strength enabling the clearance distances inside said case to be reduced.

According to another feature, the apparatus is a modular electric protection apparatus designed to be fitted on a support rail.

It is a further object of the present invention to provide an electric protection apparatus comprising a measuring device comprising the above-mentioned features taken either alone or in combination.

Figure 2:
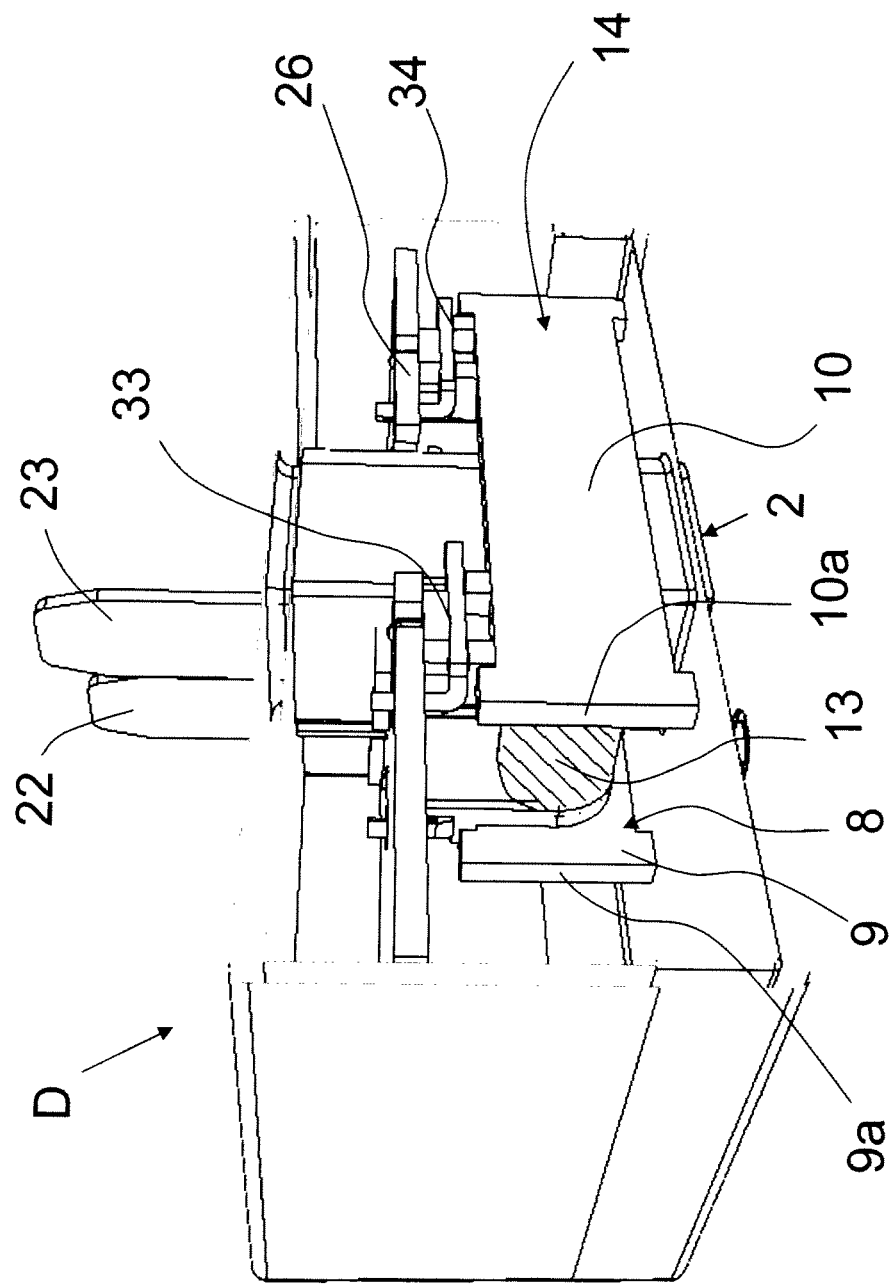
Figure 3:
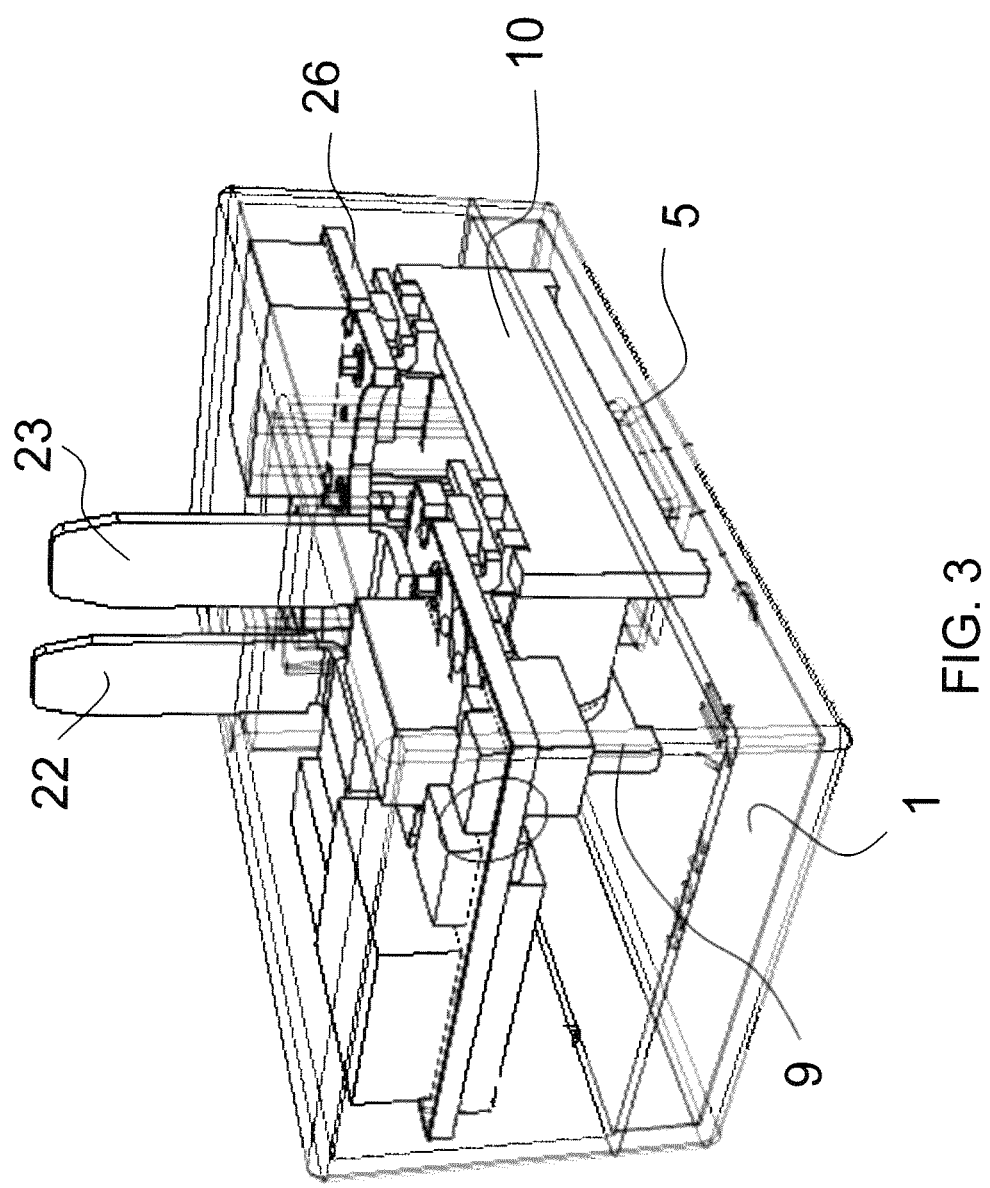
Figure 4:
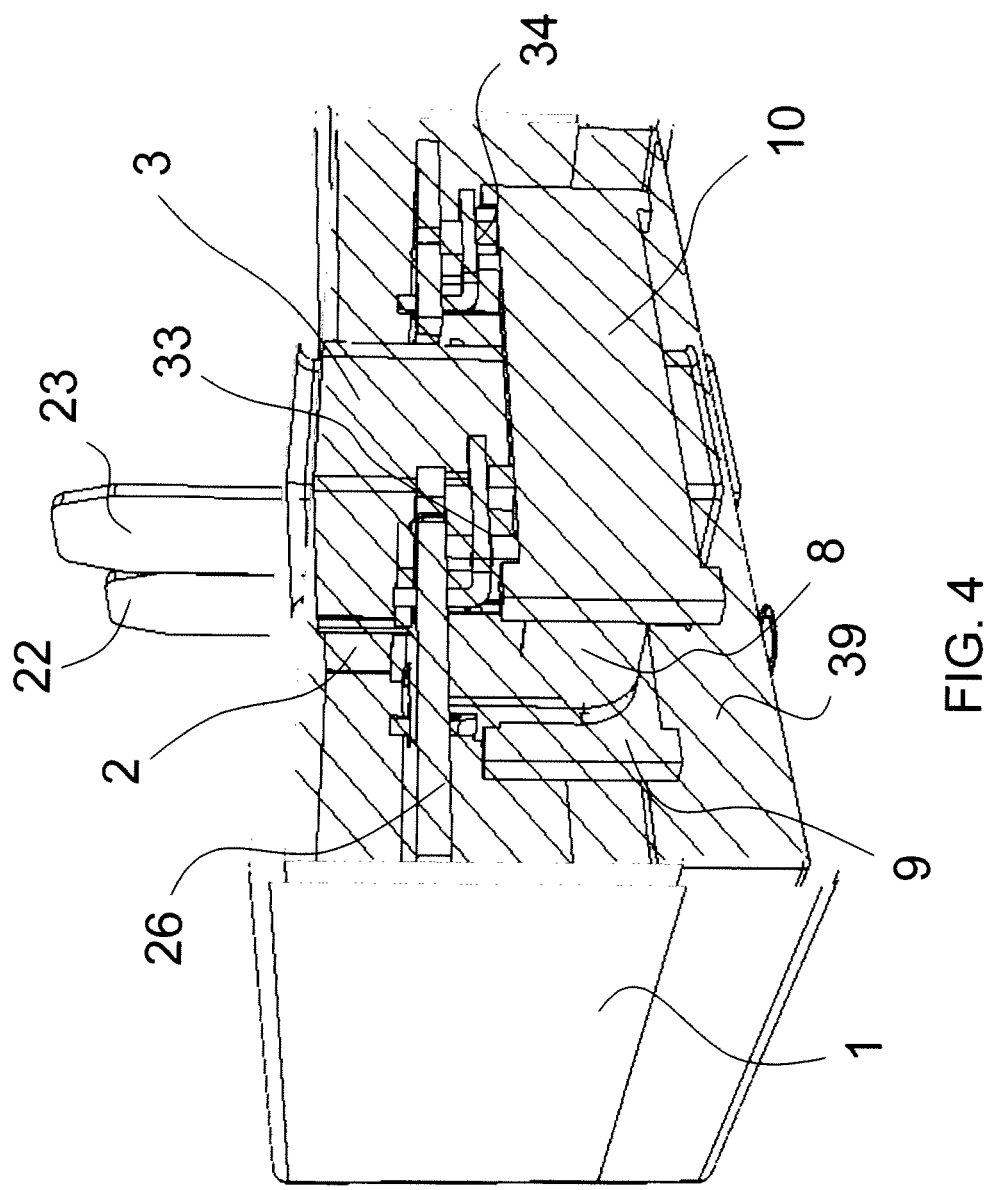
Figure 5:
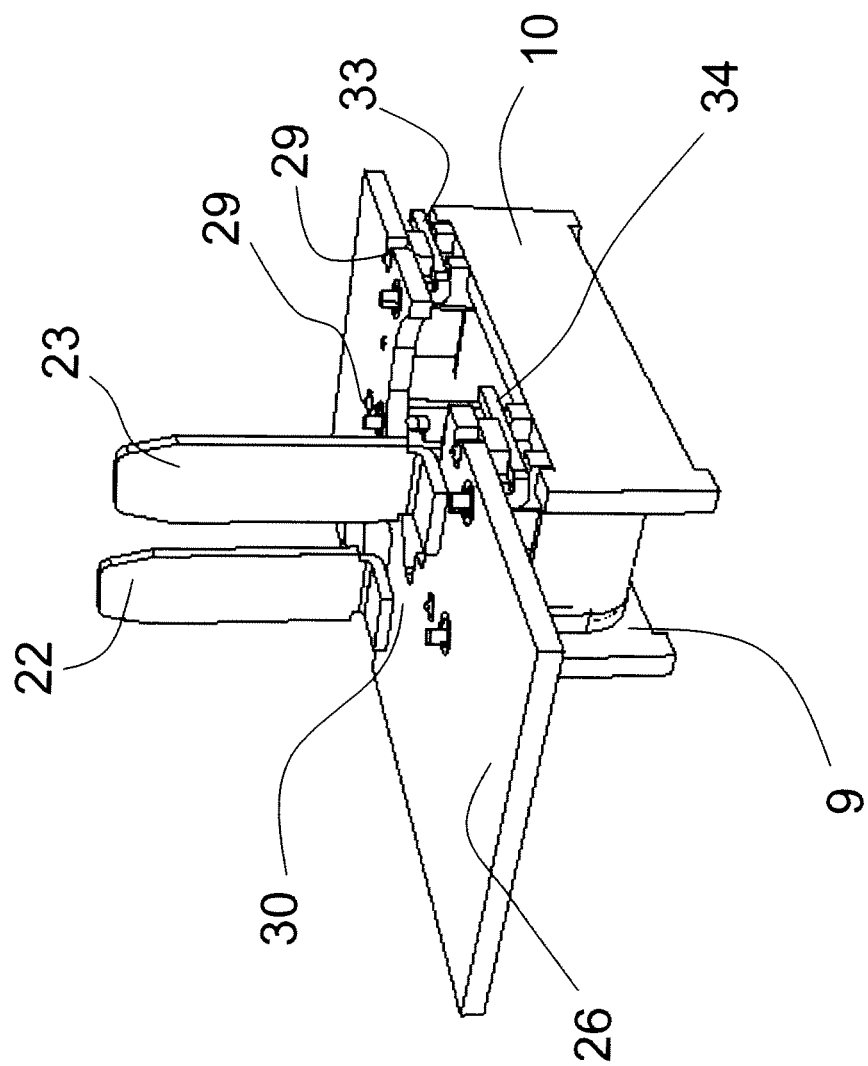
Figure 6:
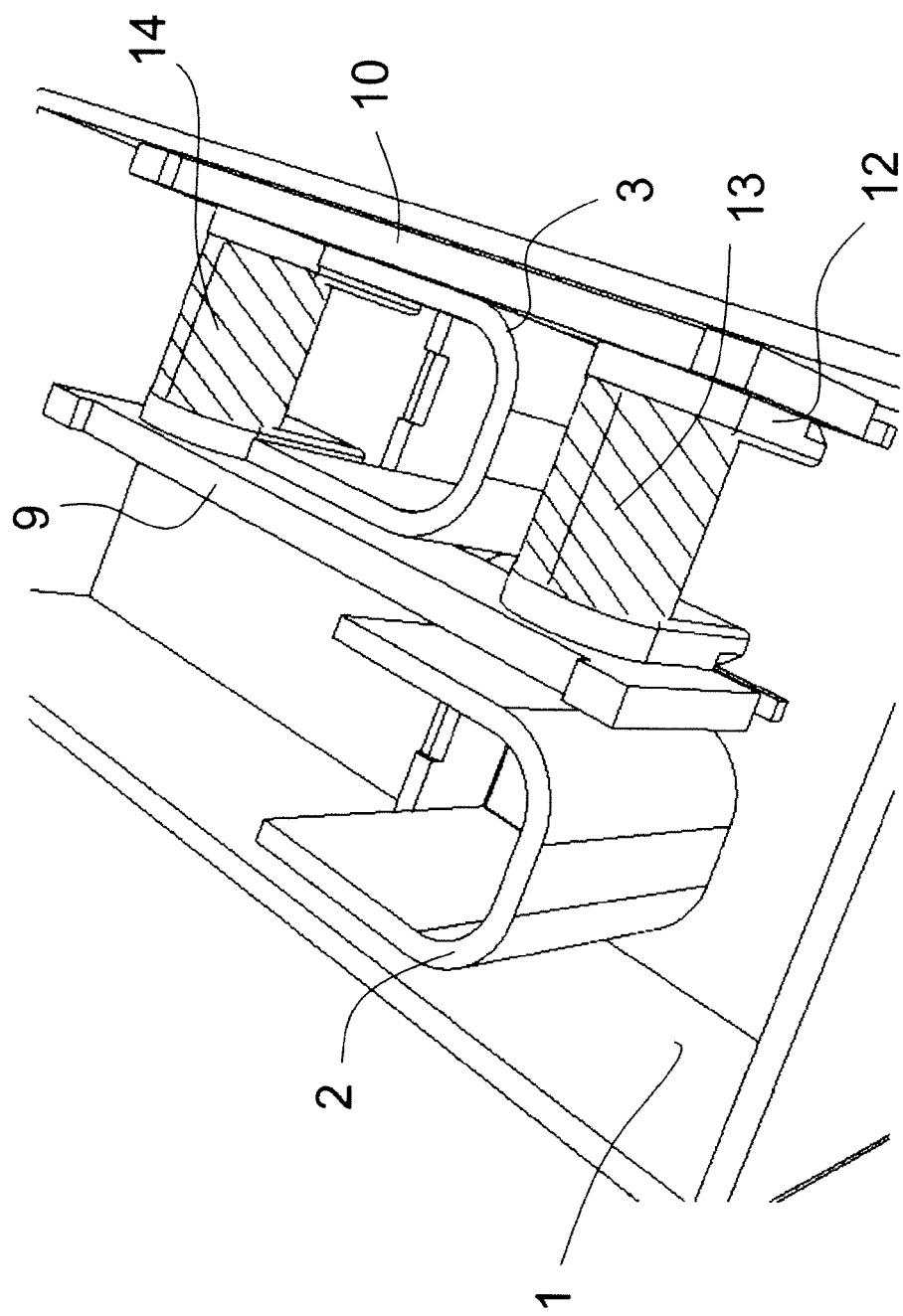
Figure 7:
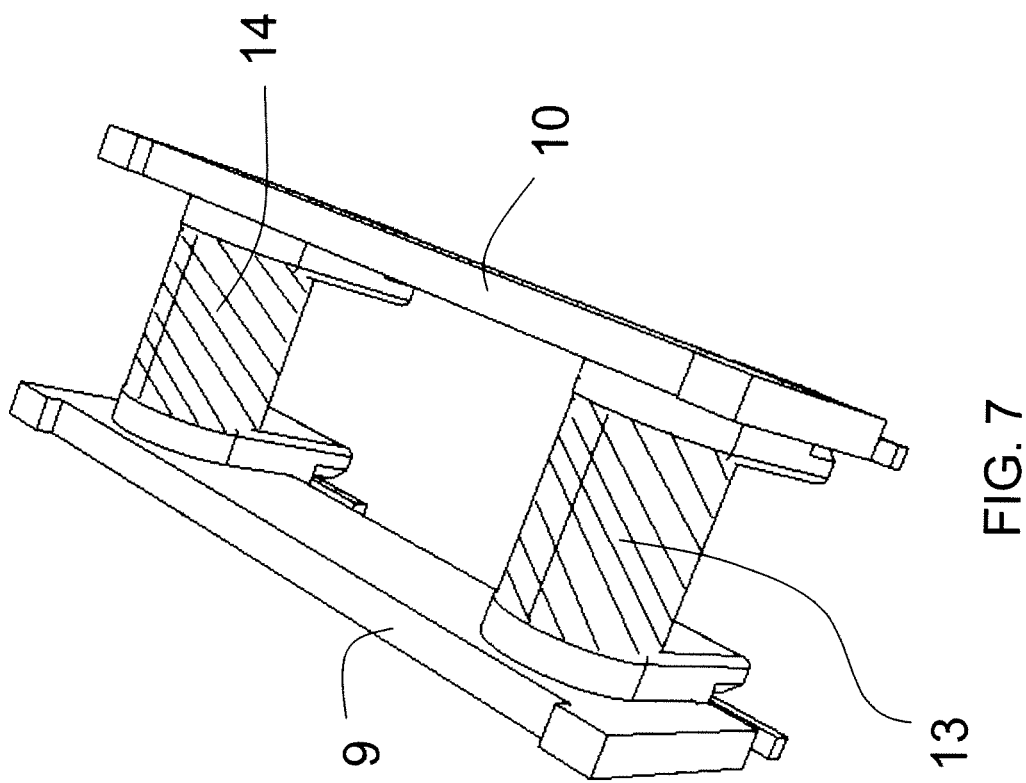
Figure 8:
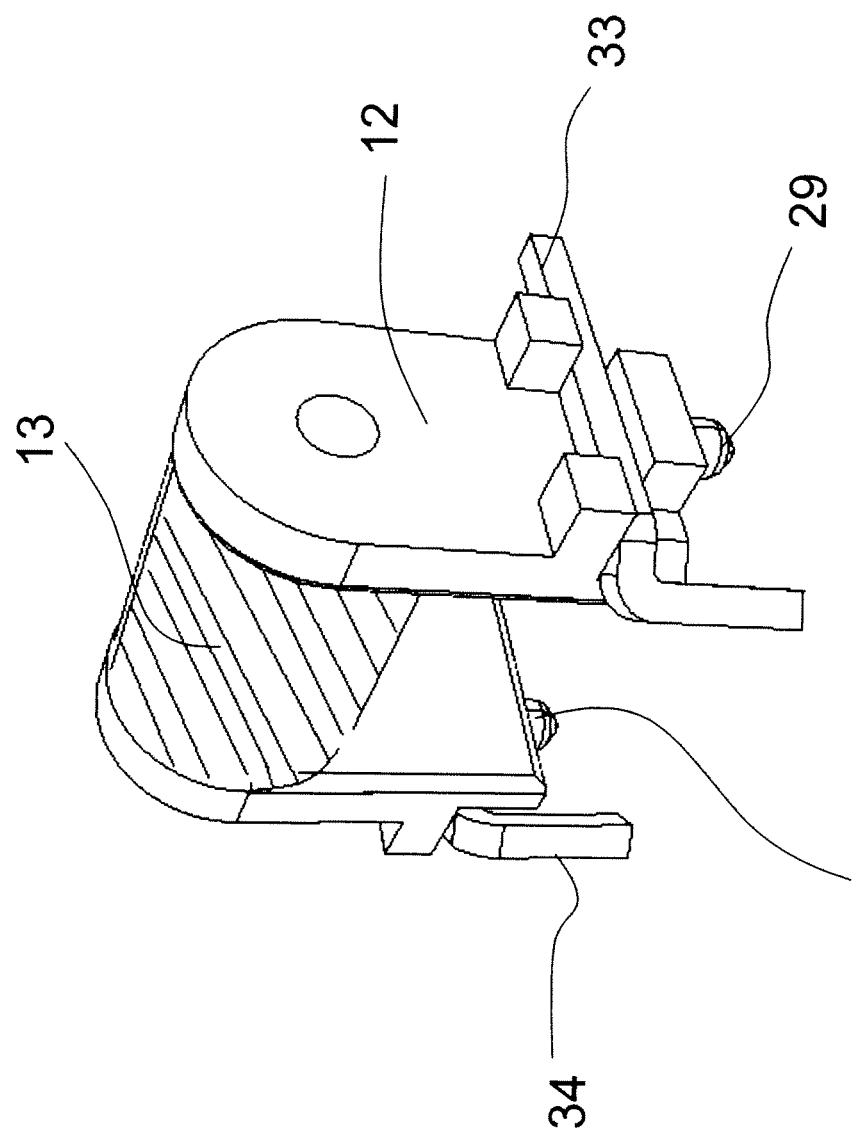
Figure 9:
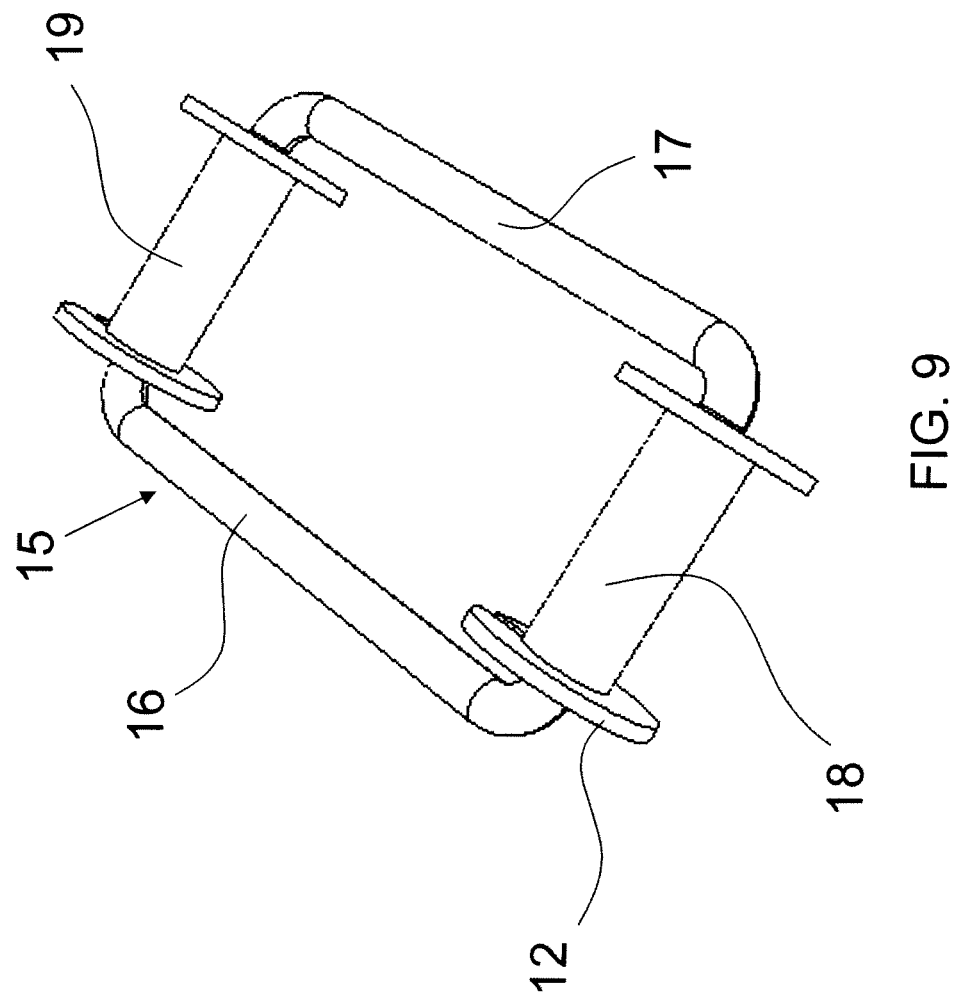
Figure 10:
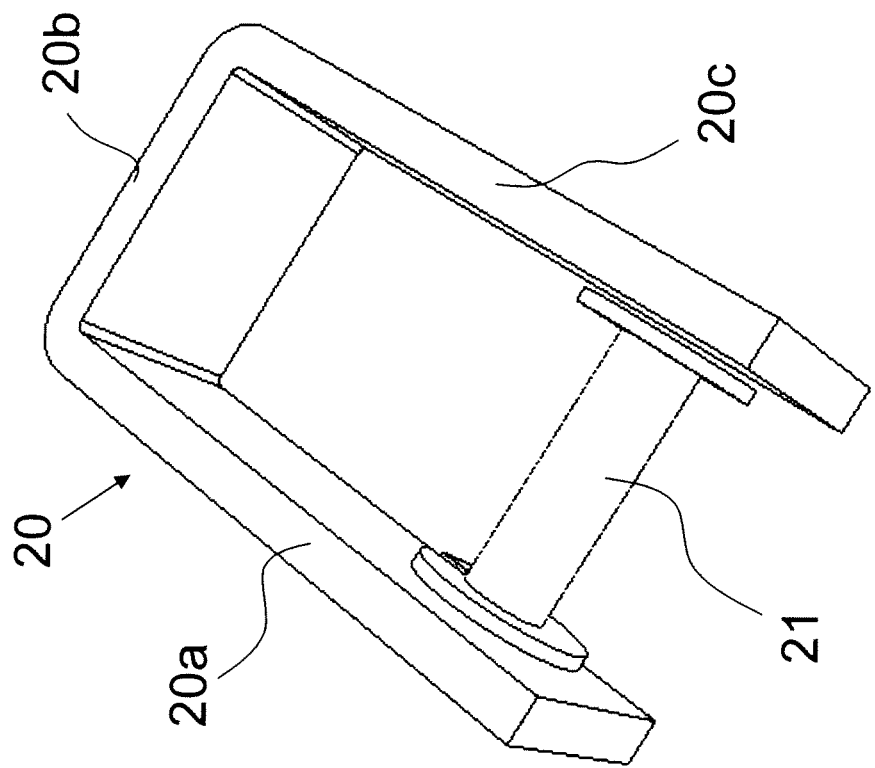
Figure 11:
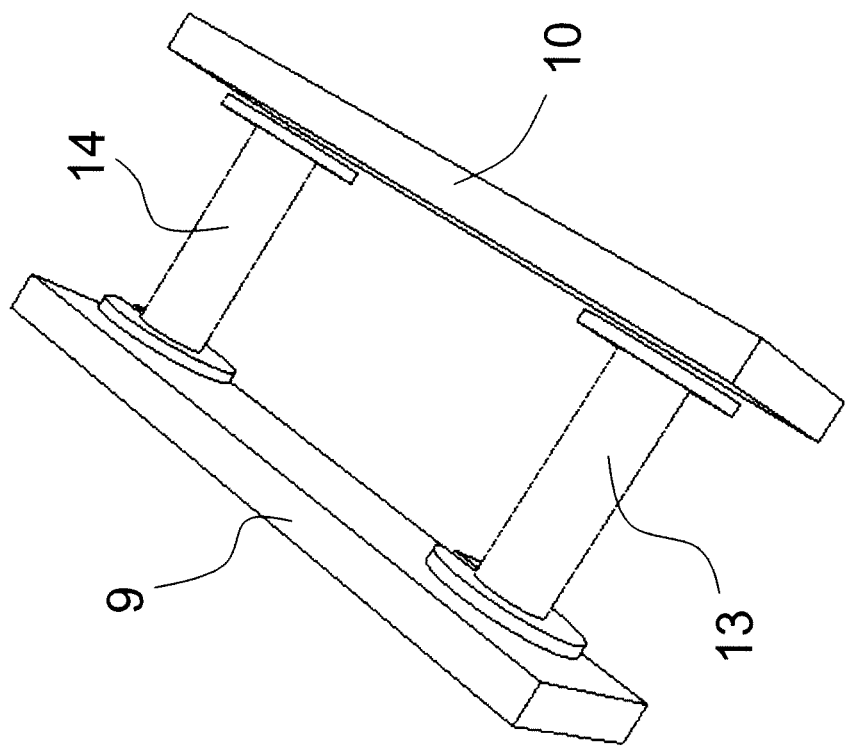
Figure 12:
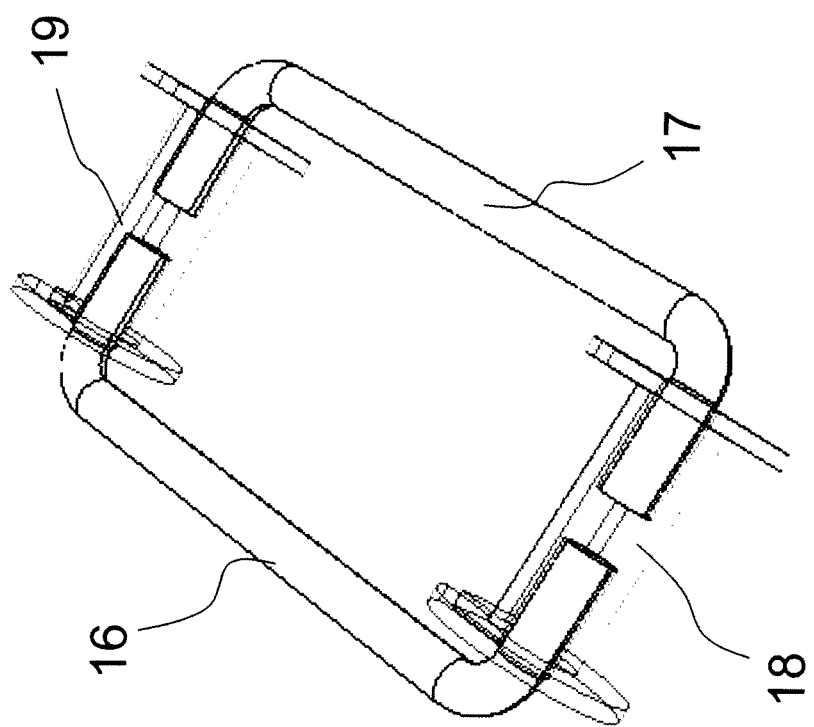
Figure 13:
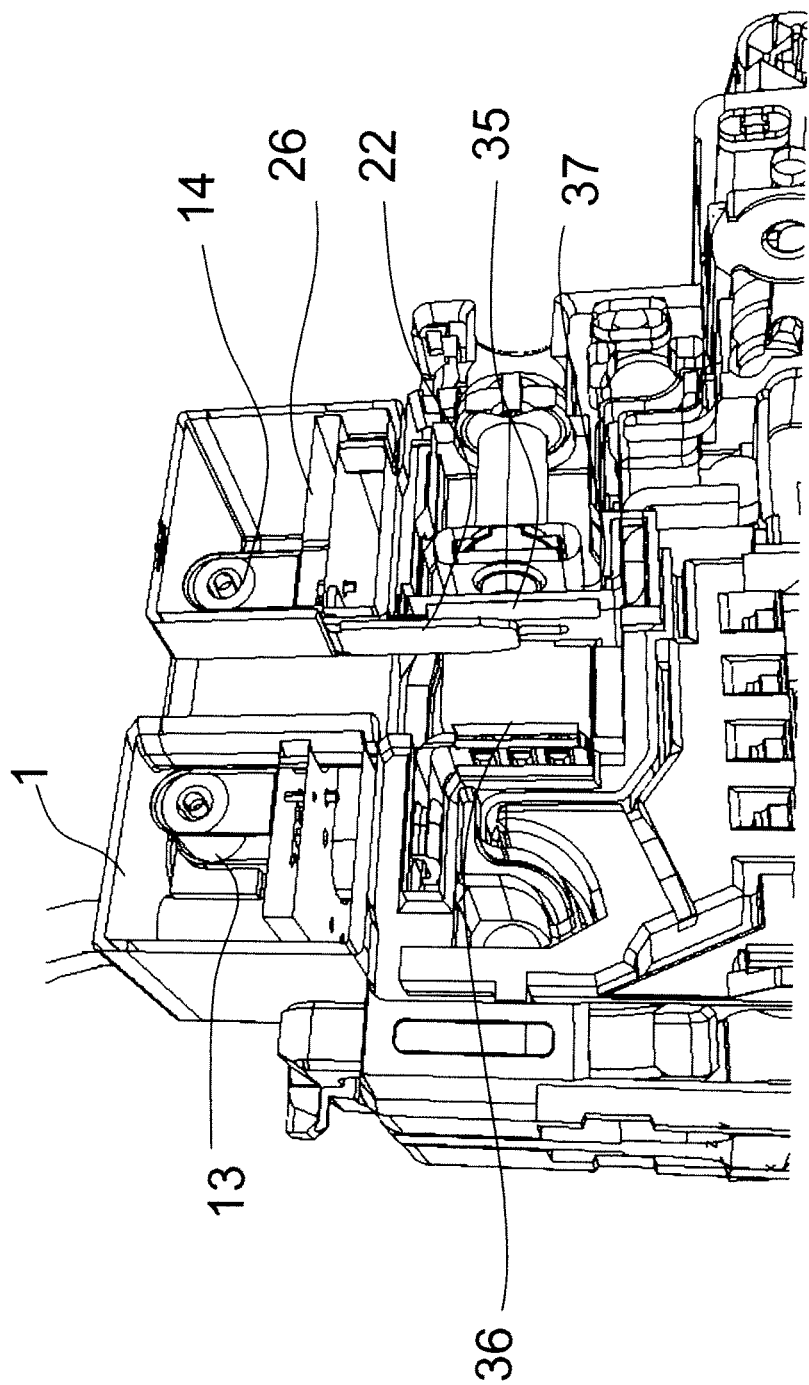

But other advantages and features of the invention will become more clearly apparent from the following detailed description which refers to the appended drawings given for example purposes only and in which:

FIG. 1 illustrates, in perspective view, a measuring device ready to be fitted on an equipment unit, FIG. 2 is a similar view to the previous figure showing certain elements of the innards of the device, FIG. 3 is a perspective view illustrating the innards of said device more completely by transparency of the walls, FIG. 4 is a similar view to FIG. 3, but illustrating coating of the innards of the device according to a particular embodiment of the invention, FIG. 5 is a partial perspective view illustrating only the innards present in FIGS. 2 and 4, FIG. 6 is a partial perspective view illustrating the bottom part of the case of the device according to the invention, comprising two terminals or pass-through holes one of which is equipped with a current sensor, FIG. 7 is a partial view illustrating only the current sensor comprising the core and the two coils, FIG. 8 is a partial view illustrating the coil and its output conductors, FIGS. 9, 10 and 11 illustrate three different embodiments of the current sensor according to the invention in perspective view, FIG. 12 is a similar view to FIG. 9, but showing the air-gap by transparency of the coil, FIGS. 13 and 14 are partial perspective views illustrating the innards of an electric equipment unit equipped with a measuring device according to the invention, respectively in a position in which the conductor has not yet been inserted into the device and in a position in which the conductor has already been inserted into the device.

In FIGS. 1 to 4, a device D for measuring an electric current and voltage according to the invention can be seen, designed to be associated with an electric equipment unit so as to measure the current and voltage flowing in said equipment unit. This device is housed in a case 1 of substantially parallelepipedic shape having a width substantially equal to that of the protection apparatus and a height enabling it to be integrated between two lines of equipment units fitted and wired in an electric cabinet on rails separated by a standard height, said case 1 containing two pass-through holes forming terminals 2,3 securely affixed to the bottom wall of the case, said terminals being located facing two holes 5 provided in the bottom wall of the case, said holes 5 being designed to respectively allow two conductors to pass (not shown), said electric conductors being designed to electrically connect the contact strips of said equipment unit with the terminals of an apparatus (not shown) located load-side or line-side. As is particularly illustrated in FIGS. 1 to 8 and 11, this measuring device comprises a sensor, said sensor being formed in this particular illustrated embodiment by a magnetic core 8 (FIG. 2) composed of two I-shapes 9,10 separated by a certain distance corresponding to the length of two parts of supports 12 of two coils 13,14, each respectively fitted between two facing ends of the two I-shapes. These secondary coils are inserted between the metal plates, preferably towards the ends of the branches of the I-shapes. Measurement by the coil is performed in air at the level of the air-gaps. The ends of the branches of the I-shapes overshoot the coils by a greater length than the minimum required for fitting the coils at the end of the branches of the I-shapes in order to minimize the possible influence of external magnetic fields which could disturb the measurements. It should be noted that the order of magnitude of the overshoot should advantageously be a length equal to the width of the magnetic circuit. These overshoots act as magnetic shields against the magnetic radiation external to that of the conductor passing through the sensor. These I-shapes are metal plates which have the function of channelling the magnetic flux to the air-gaps necessary for measuring the current for the ratio between the measured current and its image on output from the coil to be linear from a low value of the current to be measured up to a high value, ranging from a measurement of about 100 mA to 400 A or even 4000 A. This enables the coils to be placed in areas of the case having a sufficient volume to be able to contain them. There is however substantially only 1 mm between the partitions of the two holes passing through the case. In the case of an embodiment comprising a coil with an air core, it is not possible to surround the hole with a coil as the distance that separates the two terminals of the protection apparatus is too small. Each I-shape is formed by stacking of metal plates (for example three plates with a thickness of 0.3 mm), or by a single large metal plate or a single plate made from sintered material. This material is advantageously orientated grain FeSi3%. This sensor, in this embodiment, is almost insensitive to external disturbances on account of the metal plates and their overshoot. This sensor is also insensitive to the positioning of the primary cable due to the two coils. The thickness of the I-shapes is about 1 mm.

According to another embodiment of the current sensor illustrated in FIGS. 9 and 12, this sensor is composed of two parts. The first part comprises a magnetic core 15 composed of two U-shapes 16,17 separated by two air-gaps. The second part comprises two measuring coils 18,19 fitted around said air-gaps, said coils being connected in series and delivering a derived signal which is an image of the primary current.

In order to comply with geometric requirements, the magnetic U-shapes 16,17 can be made with a drawn round wire having a diameter of 1 mm, or any other shape, a usable type of material being FeSi or FeNi. In order to improve the linearity of the sensor, the magnetic U-shapes can be made from nanocrystalline materials by stacking of a certain number of layers of nanocrystalline material of very small thickness. This embodiment results in a large gain due to the presence of material underneath the coils, and is insensitive to the positioning of the primary cable due to the presence of the two coils. According to another embodiment illustrated in FIG. 10, this sensor comprises a U-shaped magnetic core 20 composed of three branches 20a,20b,20c welded to one another, these three branches themselves being formed by stacking of metal plates (for example three plates with a thickness of 0.3 mm), this material being able to be orientated grain FeSi3%. The thickness of the branches of the U is about 1 mm.

in this case, a single coil 21 is necessary and in the same way as for the previously described cases, the secondary coil 21 is inserted at the end of the branches of the U-shape 20 with an air-gap that is as small as possible, the end of the branches of the U-shape having to overshoot the coil 20 to minimize the possible influence of external magnetic fields.

As illustrated in FIGS. 1 to 5 and 13,14, the device according to the invention also comprises two pins 22,23 the function of which is on the one hand to tap the voltage at the level of the terminals of the equipment unit, and on the other hand to perform securing of the case 1 of the device according to the invention with respect to the case of the equipment unit after said pins 20,21 have been inserted in said terminals. These pins therefore comprise one end designed to be connected to said terminal and one end designed to be fixed and electrically connected to a data processing printed circuit card 26.

Referring more particularly to FIGS. 5 and 8, it can also be seen that the support 12 formed by a coil shell 13,14 is fixed onto the printed circuit card 26 by means of studs 30 integral to said coil support 11,12 and collaborating with openings provided on the printed circuit card 26.

Referring to FIGS. 5 and 8, it can also be seen that the device also comprises elements 33,34 for electric connection of the ends of the coil 13 to the printed circuit card.

It should be noted that capacitive power supply and voltage measurement by resistive divider require EMC levels and therefore clearance distances to be respected.

Thus, to circumvent or at least to reduce these clearance distances, the innards of the device and in particular the printed circuit card have been coated 39 by means of a high dielectric strength resin (for example 19 kV/mm) enabling these distances to be reduced so as to be able to integrate all the electronic components and the sensor in the case, and to thereby be able to perform power measurement in a device of very small size corresponding to the width of the case of the protection apparatus and able to be inserted between two lines of equipment units fitted and wired on rails in a cabinet.

In FIGS. 13 and 14, the current measuring device according to the invention is fitted on the equipment unit. In this position, the securing pins 22,23 are inserted in the terminals of the equipment unit and are pressing on two surfaces 35 respectively belonging to the two terminals so as to perform securing of the case 1 of the device D with respect to the case of the equipment unit. In this position, the pins are also in electric contact with the contact strips 37 of the terminals of the equipment unit so as to enable voltage tapping.

In FIG. 13, there is no conductor inserted in the device, whereas in FIG. 14, a conductor 6 passes through the device to be connected to the terminal of the equipment unit thus performing electric connection between said equipment unit and an electric apparatus situated load-side or line-side from the latter (not shown). In this position, the coils supplied by means of a magnetic coupling deliver a derived signal which corresponds to the image of the primary current.

This device enables the current and voltage of a branch (or feeder) of an electric installation protected or disconnected by a switchgear unit to be measured and the power to be calculated. The overall dimensions of this product are very limited. Measurement of the current is performed in non-intrusive manner, i.e. without hiding the terminals of the equipment unit or adding connection terminals. The sensor can be inserted in the circuit of any existing protection or switchgear unit without any modification of the latter or of the electric installation, which gives the equipment unit manufacturer and fitter a great flexibility.

A miniature sensor able to be fitted in the available volume has thus been achieved by means of the invention, enabling dimensional constraints to be circumvented and complying with the measurement precision objectives of class 2 (or even 1 or 0.5 according to the range) for currents able to vary from 1 to 4000, and a sensor having a linear behaviour for this current variation.

The invention has enabled miniaturization of the sensor by means of use of a magnetic circuit which enables the air-gap be transferred to an area where the coils are able to be fitted.

It should be noted that this device can be fitted alone, associated with a circuit breaker, or integrated in a circuit breaker.

It should also be noted that this device is not limited to current measurement. It also performs measurement of voltage and calculation of power and energy.

It should also be noted that the three branches of the U can be achieved in different manners, i.e. in a single sintered unit, by means of folded metal plates or welded metal plates.

It should be noted that in the case of a single-phase sensor, a single sensor (magnetic core) will be fitted, whereas in the case of a sensor comprising several phases, as many sensors will be fitted as there are phases.

The invention thus applies particularly to measurement of energy in an electric panel, that can apply to any apparatus for which it is necessary to measure the current flowing through the apparatus, and also the voltage and energy.

Naturally, the invention is in no way limited to the described and illustrated embodiments which have been given for example purposes only.

Thus for example the wires of the magnetic U could present another cross-section than a round cross-section, for example they could be of square, rectangular or other cross-section.

The magnetic U-shapes can be made from another material than FeSi or FeNi. The latter can in fact be made from nanocrystalline material.

On the contrary, the invention extends to encompass all the technical equivalents of the described means as well as combinations thereof if the latter are achieved according to the spirit of the invention.

The invention claimed is:

1. A device for measuring the electric current flowing in an electrical equipment unit, said device being housed in a case for fitting on a mounting support, said case having a plurality of holes therethrough, the device comprising:
   a plurality of conductors, one of which passes through each of said holes, respectively, thereby comprising terminals of the device;
      one end of each of said conductors for electrical connection to an electrical contact of a first electrical equipment unit, and the opposite end of each conductor for electrical connection to an electrical contact of an electrical apparatus located on either the load side or the line-side of said first electrical equipment unit,
   wherein at least one of the terminals of the device comprises a magnetic core at least partially surrounding said device terminal and a secondary measuring coil wound between two adjacent end portions of said magnetic core thereby defining at least two air gaps each of which is surrounded by a secondary measuring coil and said magnetic core, each said coil for generating a signal representative of the current flowing in an electrical equipment unit;
      wherein said device is fitted inside a first case for being removably fixed in a second case of the equipment unit; and
      wherein the first case comprises two pins salient from an outer surface of said first case, for voltage tapping on contact strips of terminals of the equipment unit via first ends of said pins, and for securing the first case with respect to the second case, said pins being electrically connected via their opposite ends to voltage measuring means.

2. The measuring device according to claim 1, wherein the magnetic core comprising two U-shaped parts.

3. The measuring device according to claim 2, wherein the magnetic core comprises two U-shaped parts separated by two air-gaps, a secondary measuring coil around each of the two air-gaps, and said coils being connected in series for delivering a signal representative of the current flowing in the apparatus.

4. The measuring device according to claim 3, wherein the two U-shaped magnetic core parts comprise a drawn round wire presenting having a diameter of about 1 mm.

5. The measuring device according to claim 3, wherein the two U-shaped magnetic core parts are Fe Si or Fe Ni.

6. The measuring device according to claim 3, wherein the U-shaped parts are a stacked plurality of layers of nanocrystalline material.

7. The measuring device according to claim 1, wherein the magnetic core a comprises two U-shaped parts each comprising two end parts, and end parts of two adjacent U-shaped parts are separated by an air-gap, over which is located a secondary coil for measuring the current flowing in an equipment unit.

8. The measuring device according to claim 7, wherein a magnetic core comprises three branches welded to one another, and each of said three branches comprises a stack of metal plates.

9. The measuring device according to claim 8, wherein the branches are oriented grain 3% FeSi.

10. The measuring device according to claim 1, wherein the magnetic core comprises two separate I-shapes forming two air-gaps between them at their ends, each I-shape for channeling magnetic flux, each air-gap being formed by two facing end parts of the two I-shapes, each air-gap including a secondary measuring coil between two facing end parts of the two I-shapes.

11. The measuring device according to claim 10, wherein each I-shape comprises a stack of metal plates of oriented grain 3% FeSi.

12. The measuring device according to claim 10, wherein the ends of the branches of the I-shapes extend beyond the coils to minimize possible influence of external magnetic fields.

13. The measuring device according to claim 1, wherein the pins are electrically connected to a printed circuit card comprising the voltage measuring means.

14. The measuring device according to claim 1, wherein at least a part of the elements located inside the first case are coated in a resin having a high dielectric strength, thereby permitting reduced clearance distances inside said case.

15. The measuring device according to claim 1, wherein the apparatus is a modular electric protection apparatus designed to be fitted on a support rail.

16. An electric protection apparatus comprising a measuring device according to claim 1.

* * * * *